(12) United States Patent
Batt

(10) Patent No.: US 8,049,530 B2
(45) Date of Patent: Nov. 1, 2011

(54) OUTPUT IMPEDANCE CALIBRATION CIRCUIT WITH MULTIPLE OUTPUT DRIVER MODELS

(75) Inventor: Wayne Batt, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/424,684

(22) Filed: Apr. 16, 2009

(65) Prior Publication Data
US 2009/0201047 A1    Aug. 13, 2009

Related U.S. Application Data

(63) Continuation of application No. 11/210,099, filed on Aug. 22, 2005, now Pat. No. 7,535,250.

(51) Int. Cl.
*H03K 17/16*    (2006.01)
*H03K 19/003*    (2006.01)

(52) U.S. Cl. ............ 326/30; 326/87; 327/112; 324/601; 716/106

(58) Field of Classification Search .......... 326/30, 326/82–83, 86–87; 703/16; 324/601; 702/FOR. 105; 716/1–21, 101, 106–131; 327/108–109, 327/112
See application file for complete search history.

(56) References Cited

U.S. PATENT DOCUMENTS

| | | | | |
|---|---|---|---|---|
| 6,064,224 A * | 5/2000 | Esch et al. | ........................ | 326/30 |
| 6,326,802 B1 * | 12/2001 | Newman et al. | ................. | 326/30 |
| 6,414,525 B2 * | 7/2002 | Urakawa | ........................ | 327/112 |
| 6,573,747 B2 * | 6/2003 | Radhakrishnan | ............... | 326/30 |
| 6,812,735 B1 * | 11/2004 | Pham | ................................ | 326/30 |
| 6,836,143 B2 | 12/2004 | Song | ................................ | 326/30 |
| 6,839,286 B2 | 1/2005 | Cho et al. | ........................ | 365/189 |
| 6,924,660 B2 | 8/2005 | Nguyen et al. | ................... | 326/30 |
| 6,973,421 B1 * | 12/2005 | Bruno | ............................ | 703/14 |
| 6,980,020 B2 * | 12/2005 | Best et al. | ........................ | 326/30 |
| 7,068,065 B1 * | 6/2006 | Nasrullah | ........................ | 326/30 |
| 7,176,729 B2 * | 2/2007 | Hayashi et al. | ............... | 327/108 |
| 7,194,559 B2 * | 3/2007 | Salmon et al. | .................... | 710/8 |
| 7,345,504 B2 * | 3/2008 | Lin et al. | ........................ | 326/30 |
| 7,535,250 B2 * | 5/2009 | Batt | ................................ | 326/30 |
| 2002/0063576 A1 | 5/2002 | Kim et al. | ....................... | 326/30 |
| 2004/0008054 A1 * | 1/2004 | Lesea et al. | ..................... | 326/30 |
| 2004/0080336 A1 * | 4/2004 | Hirano | ............................ | 326/30 |
| 2004/0113654 A1 * | 6/2004 | Lundberg | ........................ | 326/30 |
| 2005/0174143 A1 | 8/2005 | Nguyen et al. | ................... | 326/30 |
| 2007/0200591 A1 | 8/2007 | Kim | ................................ | 326/30 |

* cited by examiner

*Primary Examiner* — Jason M Crawford
(74) *Attorney, Agent, or Firm* — Lerner, David, Littenberg, Krumholz & Mentlik, LLP

(57) ABSTRACT

A method and circuitry for calibration of the output impedance of output driver circuits in an integrated circuit is disclosed. The output drivers within an area on the integrated circuit are defined as a group, and an output model indicative of the operation of the output drivers and used to calibrate their output impedances is provided proximate to the output drivers. A state machine is used to query each output model, and to set the proper output enable signals for the enable transistors in the output drivers in each group so as to calibrate their output impedances. By decentralizing the output models, the process used to form the output models will, due to proximity to the output drivers in each group, be indicative of the process used to form the output drivers. Thus, when each group of output drivers is calibrated, the output models used for each will compensate for process variations as may occur across the surface of the integrated circuit. Each group of output drivers is thus separately calibrated, with the result that the output impedances are made more uniform across the various output drivers despite process variations.

26 Claims, 7 Drawing Sheets

OUTPUT IMPEDANCE CALIBRATION CIRCUIT WITH MULTIPLE OUTPUT DRIVER MODELS

CROSS REFERENCE TO RELATED APPLICATIONS

This is a continuation of U.S. patent application Ser. No. 11/210,099, filed Aug. 22, 2005, now U.S. Pat. No. 7,535,250, to which priority is claimed, and which is incorporated herein by reference.

FIELD OF THE INVENTION

This invention relates to calibration of output impedances in integrated circuits, and is particularly but not exclusively useful in Synchronous Dynamic Random Access Memories (SDRAMs).

BACKGROUND

As is well known, integrated circuits have input and output pins that respectively receive data into the circuit and output data from the circuit. In some integrated circuits, such as the Synchronous Dynamic Random Access Memory (SDRAM) 10 illustrated in FIG. 1, the data pins are combined to operate as input/output pins (i.e., DQ pins). In an SDRAM for example, the input/output pins DQx 11 are designed to input or output data from or to a bus 14, which receives or sends the data to another useful device such as a microprocessor 12 having similar input/output pins 13. Of course, the pins 11, 13 do not operate as inputs and outputs simultaneously; when one set (11) is acting as outputs, the other set (13) will act as inputs.

Given this arrangement, it is preferable that the output circuitry of one device (say, the SDRAM 10), be impedance matched to the input circuitry of the receiving device (i.e., the microprocessor 12). As is known, when the output impedance of the output circuitry on the sending device is matched to the input impedance of the input circuitry on the receiving device, the transfer of the data is more efficient and less noisy, as impedance-based reflections are mitigated through such matching.

To facilitate such impedance matching, it is known to calibrate the output impedance of the output circuitry in an integrated circuit. Known output impedance calibration circuitry 20 is illustrated in FIG. 2. As shown, the circuitry 20 as implemented in an integrated circuit includes output pads 28 (i.e., "DQ pads," or "I/O pads," although only their functionality when used as output pads will be discussed further). The output pads 28, or bond pads, provide a surface for coupling the integrated circuit to a lead frame (and eventually a pin 11 on the circuit's package) via a bond wire as is well known. Data is driven to the output pads 28 via output drivers 26. Because an integrated circuit will typically have several different output pads 28 (specifically, "Y" pads as shown), it will have a corresponding number of output drivers 26 as well.

Calibrating the output impedance at the pads 28 comprises calibrating the output impedance of the output drivers 26, which occurs in conjunction with an output model 22 and a state machine 24. As can be seen from FIG. 2, the state machine 24 provides control signal 30 on a bus to the output drivers 26, and also feeds these control signals 30 back into the output model 22.

Before discussing how the control signals 30 are generated by the output model 22 and the state machine 24, the output drivers 26 which receive the control signals 30 are first discussed with reference to FIG. 3. The input to the output driver 26 is generally provided by an output buffer or latch earlier in the output data path of the integrated circuit. As shown, the output driver circuit 26 generally comprises a number of legs 25 ("X" number of legs are shown). Each leg 25 comprises, in series, two P-channel transistors 15, 17 and two N-channel transistors 19, 21. Notice that the inner transistors 17 and 19 are gated in parallel by the input from the output latch, and, as one skilled in the art will understand, transistors 17 and 19 thus act to drive the data to the output pad 28 in inverted fashion. That is to say, parallel-wired transistors 17 and 19 essentially form a large inverter.

Transistors 15 and 21, by contrast, are enable transistors for the power (Vdd) and ground portions of the legs 25, and in effect determine which leg or leg portions will participate in driving the output. As shown, each of the X legs 25 are driven by the control signals 30 generated by the state machine 24. Because there are X P-channel transistors 15 and X N-channel transistors 21, there are a total of 2X control signals 30, with control signals 30a controlling the P-channel transistors 15 and control signals 30b controlling the N-channel transistors. However, more or fewer control signals can be used, and even a single control signal can be used in other useful embodiments.

The output impedance at the output pad 28 is modified, or calibrated, by selecting various of the enable transistors 15 and 21. For example, to minimize the output impedance to the greatest extent, state machine 24 would enable all of the enable transistors 15 and 21 (i.e., control signals 30a would be low, while control signals 30b would be high). Because the enable transistors, when on, provide parallel paths between the output pad 28 and the power supply nodes, Vdd and GND, the output impedance is minimized. Thus, when all P-channel enable transistors 15 are active, the impedance for outputting a logic '1' is minimized to its lowest extent, and when all N-channel enable transistors 21 are active, the impedance for outputting a logic '0' is minimized to its lowest extent. Should the output impedances for either logic state need to be higher, fewer than all of the enable transistors 15 or 21 would be enabled by the control signals 30a or 30b, as will be explained in further detail below. Should the output be "tri-stated" so as to output neither a logic '0' or '1,' as would be typical when the pad 28 was acting as an input, no enable transistors 15 or 21 would be enabled.

Thus, calibration of the output impedance is controlled by the control signals 30, which are in turn generated by the output model 22 and the state machine 24, which are shown in further detail in FIG. 4. As shown, the output model 22, as its name suggests, models the output drivers 26, and hence preferably has the same structure: a parallel-wired inverter with X legs, in which each leg includes P- and N-channel enable transistors. Each of the enable transistors receives the same control signals 30 as do the output drivers 26 (see FIG. 2).

Because the output model 22 is indicative of the structure of the true output drivers 26, the logic in the state machine 24 uses the output model 22 (prior to useful operation of the integrated circuit) to set the control signals 30, in effect setting the output impedances of the output drivers 26 during useful operation. To do this, output enable control 32 of the state machine 24 sends various combinations of the control signal 30a and 30b to the output model 22, and gauges its output impedance by comparing its output voltage (Vout) to a reference voltage (Vref) at an operational amplifier 31. Vref (shown here as generated as part of the output enable control 32) and resistor R are chosen so that proper output impedance is achieved when Vout equals Vref.

Thus, the output enable control 32 initially disables the N-channel transistors (Vbias2 low; Vbias1 low), and enables the various P-channel enable transistors via control signals 30b in different combinations until Vout equals Vref. (Resistor R enable control signal $N_R$ would be asserted during this assessment). In this regard, note that the widths of the transistors in the various legs of the output model 22 (and the output driver circuitry 26) may be varied (e.g., exponentially, with leg 1 having a relative width of 1, leg 2 having a relative width of 2, leg three having a width of 4, etc.) to allow the output impedance to varied over a continuum by binarily incrementing the control signals on bus 30a (from 0001 to 0010, to 0011, etc.). In any event, using this scheme, the output enable control 32 might determine for example that the second and fourth legs 25 of the output drivers 26, corresponding to control signals PE2 and PE4 in FIG. 3, need to be enabled for proper output impedance.

After the optimal control enable signals 30a for the P-channel enable transistors are set in this fashion, the proper enablement of the N-channel enable transistors are then set by the control enable logic 32. Thus, while keeping the same optimal P-channel enable transistors enabled (e.g., PE2 and PE4), the output enable control 32 steps through various combinations of the control signals 30a to enable the N-channel enable transistors. (Resistor R enable control signal $N_R$ would not be asserted during this assessment). Again, the condition Vout equals Vref (in which Vref may be a different value than when earlier optimizing the P-channel transistors) sets the optimal combination of N-channel enable transistors. For example, the output enable control 32 might determine that proper output impedance would occur when enabling the third and fifth legs 25 of the output drivers 26, corresponding to control signals NE3 and NE5 in FIG. 3.

Therefore, to summarize, output enable control 32 might determine that enablement of control signals PE2 and PE4 (30b) are optimal for outputting a logic '1,' and the enablement of control signals NE3 and NE5 (30a) are optimal for outputting a logic '0,' and thus would send these control signals to the various output drivers 26 during useful operation when these logic states need to be output.

While such output impedance calibration circuitry 20 is functional, it may not be optimal when applied to some modern day, high speed integrated circuits. FIG. 5 shows a typical layout of an integrated circuit 10 having various output pads 28 and their associated output drivers 26. In the example shown, there are 32 such pads 28 and drivers 26, indicating a x32 device, and the pads/drivers are situated near the outer periphery of the integrated circuit 10. (They could also appear elsewhere along the integrated circuit, such as in a line through its center, etc.). Consistent with the output impedance calibration scheme discussed earlier, the integrated circuit 10 also contains the output model 22 and state machine 24 to generate the output enable control signals 30 received by each output driver 26, which may occur anywhere on the layout of the circuit 10.

But the output model 22 may not be perfectly indicative of the structure of the actual output drivers 26. This is because, despite best efforts during processing, the process can and normally will vary across the circuit 10. Thus, the various layers in the circuit may have different thickness across the expanse of the circuit, the transistors may have different line widths, etc. Ultimately, such process variations cause the electrical characteristics of the circuitry to also vary. For example, assume that process variations cause the transistors near the upper left corner of the circuit to have larger line widths than otherwise comparable transistors in the lower right corner. If we assume that the transistors as appear in the output model 22 are of normal size, those in output driver $26_1$ for example would by comparison have larger line widths (more resistive), while those in output driver $26_{32}$ would have smaller line widths (less resistive).

Accordingly, when the state machine 24 attempts to discern the optimal settings for the output enable control signals 30 to calibrate the output impedance, the result will be that the output impedance at output pad $28_1$ is too high, while that at output pad $28_{32}$ will be too low. Thus, while a device such as microprocessor 12 (FIG. 1) coupled to the circuit 10 will expect the same output impedance of all signals sent via bus 14, that goal may not be attainable, as thus the different signals on the bus 14 will suffer different reflection characteristics, hampering performance.

Accordingly, the art would be benefited by a solution to this problem, and is provided herein.

SUMMARY

A method and circuitry for calibration of the output impedance of output driver circuits in an integrated circuit is disclosed. In one embodiment, the output drivers within an area on the integrated circuit are defined as a group, and an output model indicative of the operation of the output drivers and used to calibrate their output impedances is provided proximate to the output drivers. A state machine is used to query each output model, and in so doing to set the proper output enable signals for the enable transistors in the output drivers in each group so as to calibrate their output impedances. By decentralizing the output models in this fashion, the process used to form the output models will, due to proximity to the output drivers in each group, be indicative of the process used to form the output drivers. Thus, when each group of output drivers is calibrated, the output models used for each will compensate for process variations as may occur across the surface of the integrated circuit and across the groups. Each group of output drivers is thus separately calibrated, with the result that the output impedances are made more uniform across the various output drivers despite process variations.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1:
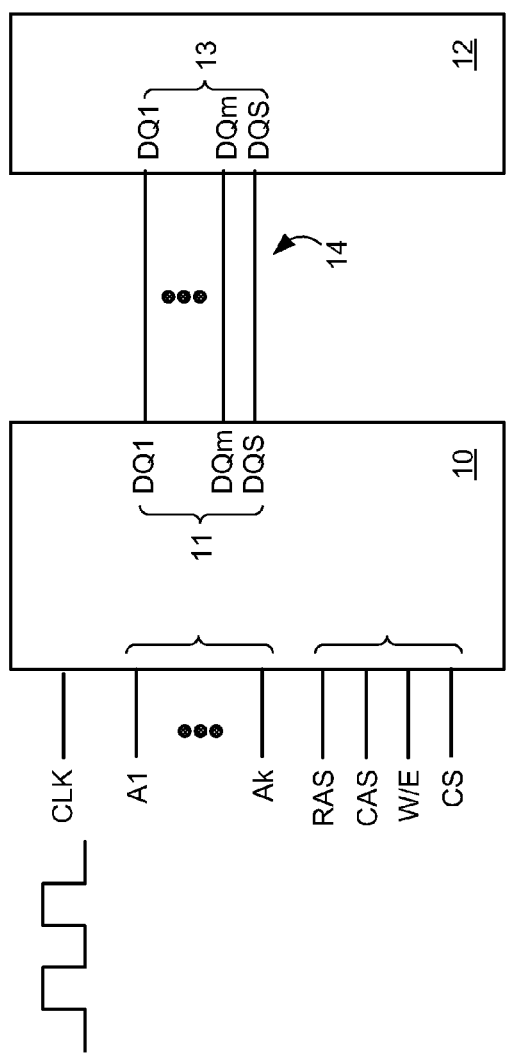
FIG. 1 illustrates a prior art SDRAM, and specifically shows communication between the SDRAM and a microprocessor along a bus in accordance with the prior art.
Figure 2:
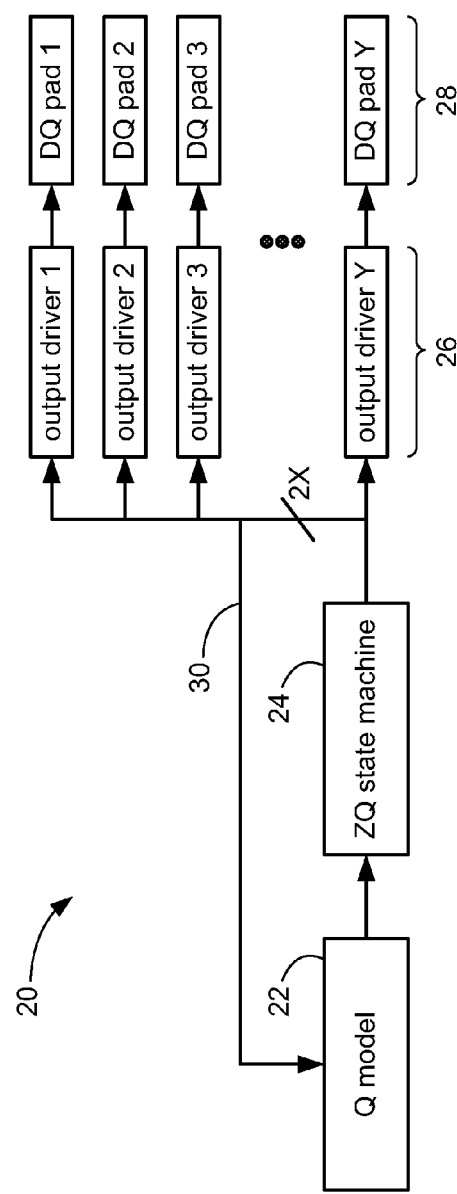
FIG. 2 illustrates output impedance calibration circuitry and output driver circuitry in accordance with the prior art.
Figure 3:
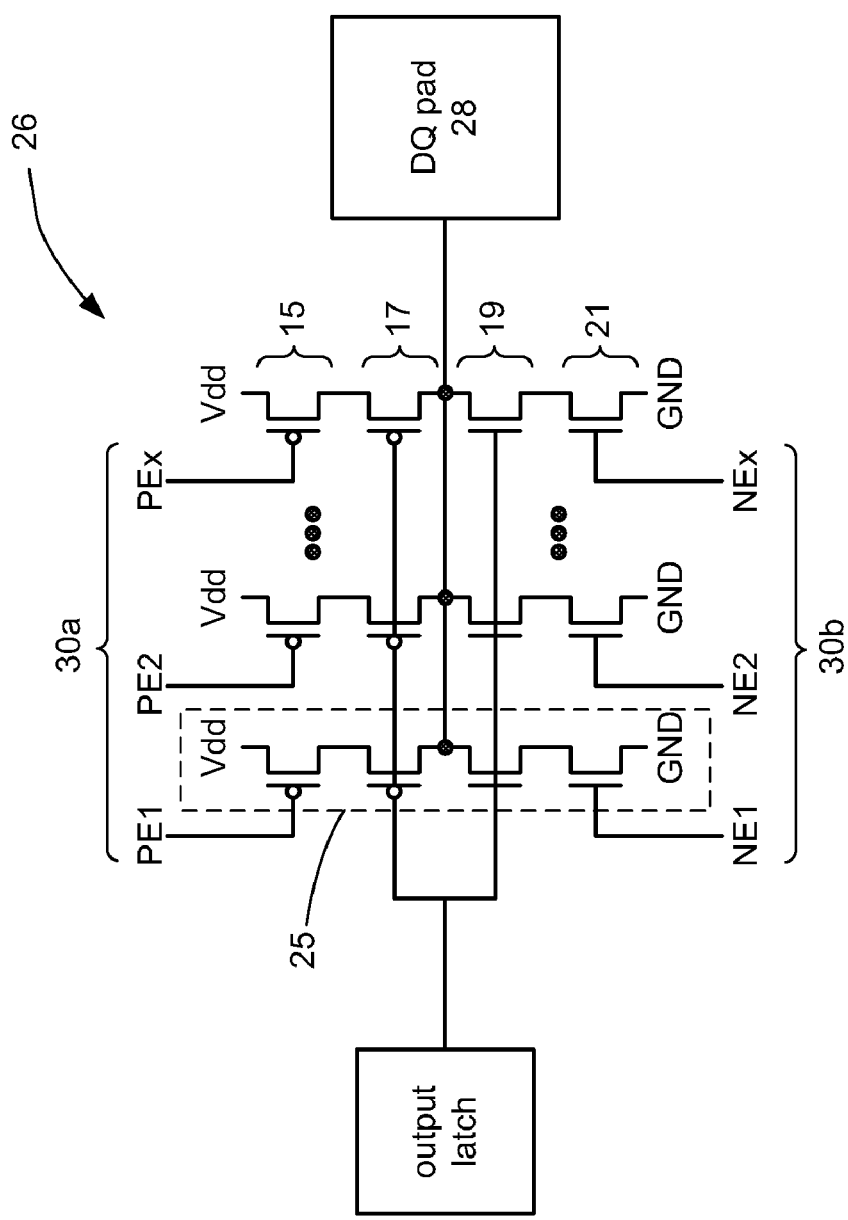
FIG. 3 illustrates the output driver circuitry of FIG. 2 as controlled by control signals in accordance with the prior art.
Figure 6:
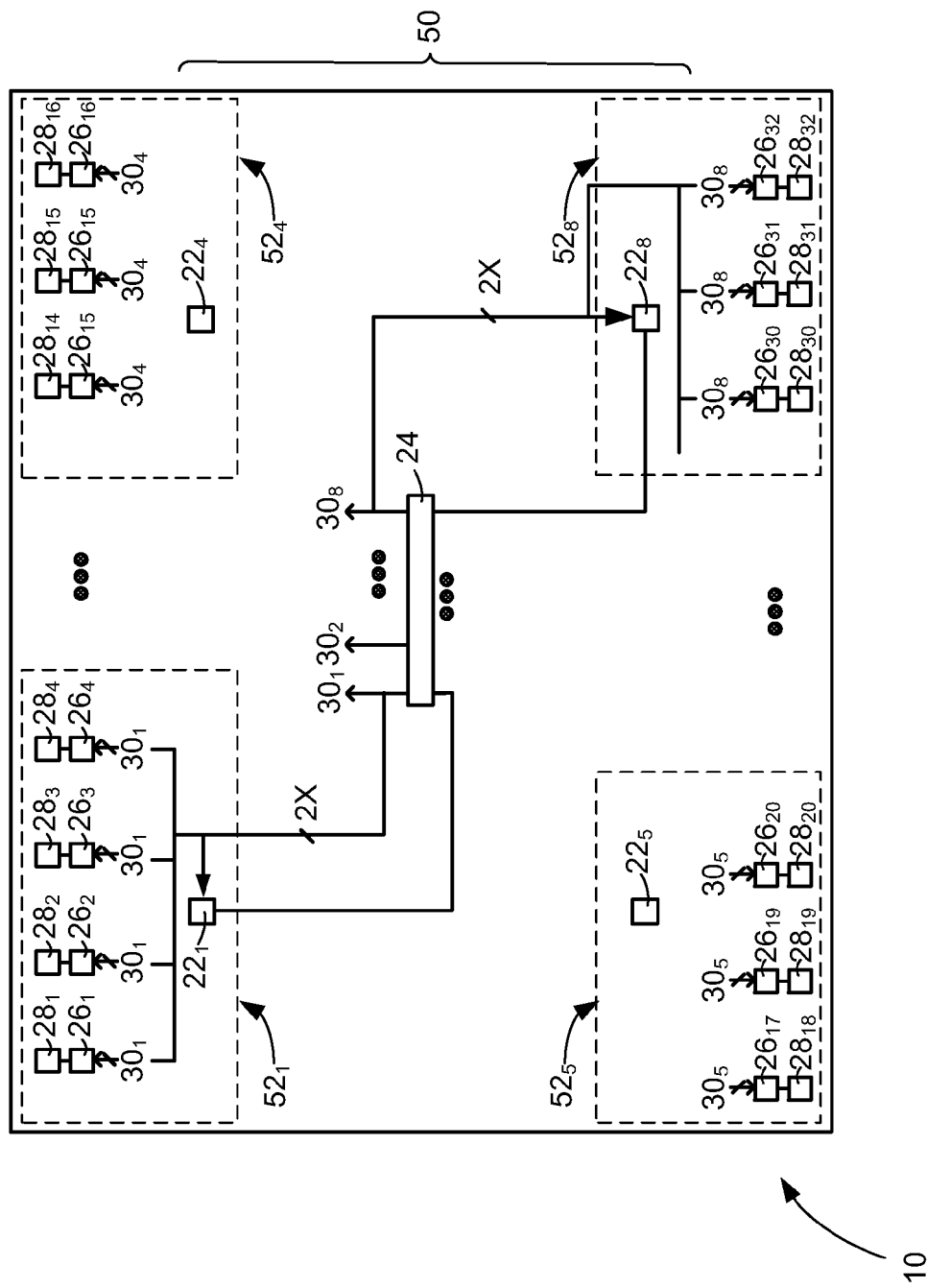
FIG. 6 illustrates the improved output calibration circuitry and an example of how such circuitry can be laid out on an integrated circuit, most particularly by including a plurality of output models each in proximity to a group of output drivers it models.

In one embodiment, the problem of output impedance calibration in light of process variations across the expanse of an integrated circuit is addressed through use of the improved output impedance calibration circuitry 50 shown in FIG. 6. As shown, the improved circuitry 50 includes multiple output models 22 distributed about the surface of the integrated circuit 10. Each of the output models 22 are proximate to a group of output pads 28, and more particularly to a group of output drivers 26 for those pads, such that each output model 22 and its associated output drivers 26 generally fall within a particular proximate area 52. For example, as shown, each output model 22 is proximate to and helps to calibrate the output impedance of four output drivers 26. Thus, output model $22_1$ corresponds to output drivers $26_1$ through $26_4$, all of which are located in an area $52_1$; output model $22_2$ corresponds to output drivers $26_5$ through $26_8$, all of which are located in an area $52_2$, etc. Thus, for the x32 integrated circuit depicted, eight output models 22 and areas 52 are present. This is shown in block diagram form in FIG. 7. The output models $22_x$ and output drivers $26_x$ preferably comprise the circuitry as shown in FIGS. 2 and 3.

Figure 7:
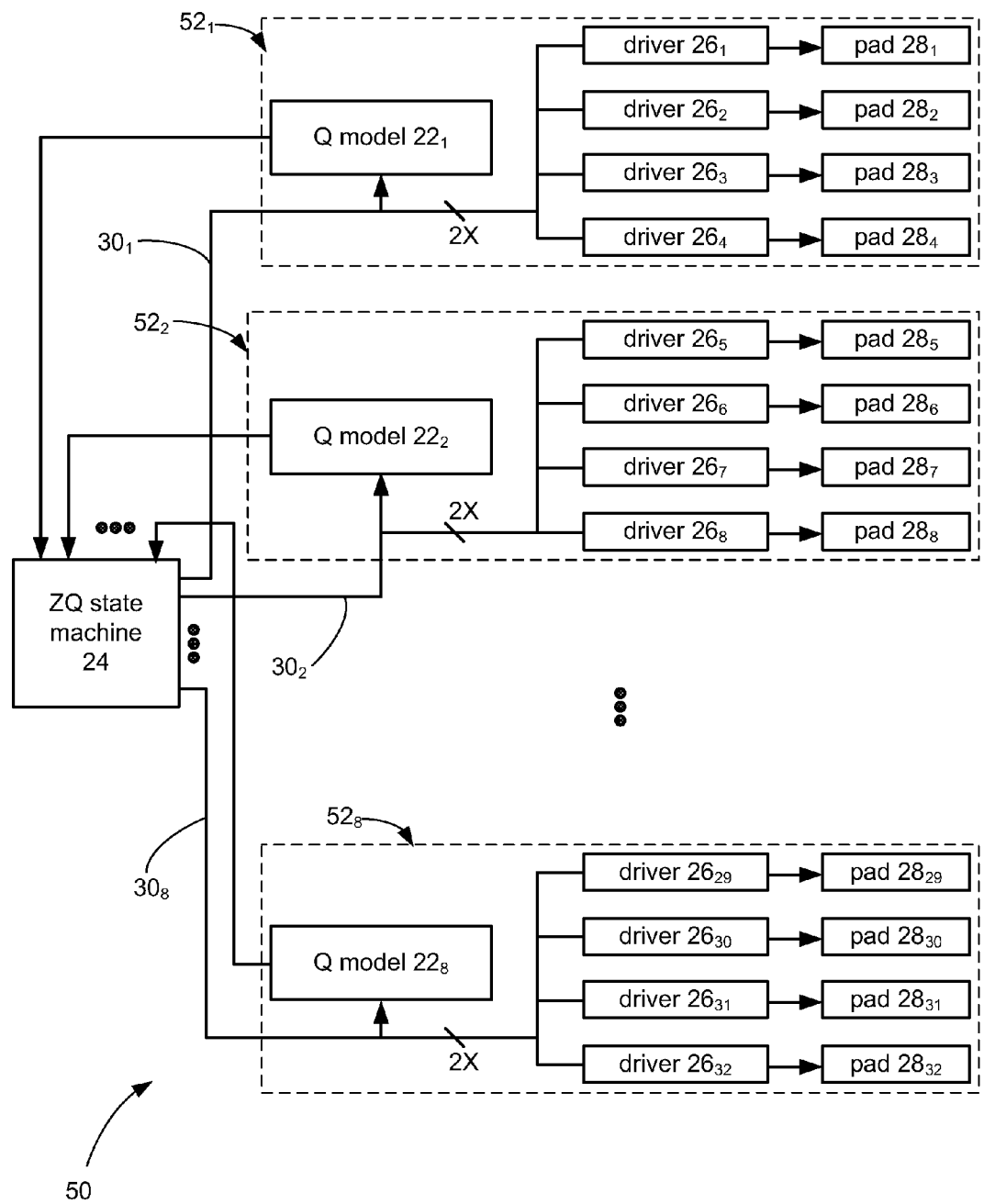
FIG. 7 illustrates an example of the improved output calibration circuitry in block diagram form.

In the embodiment shown in FIGS. 6 and 7, a centralized state machine 24 is used to control each output model 22, preferably in the manner discussed in the Background section. To briefly reiterate, the state machine 24, prior to useful operation of the integrated circuit 10, enables the various enable transistors in each of the output models 22 via a control signal bus 30 to arrive at an optimal setting of the enable transistors (15, 21; FIG. 3) in the associated output drivers 26 from an output impedance standpoint. Accordingly, the control signal bus 30 is divided into sub-busses to service each output model. Thus, sub-bus $30_1$ services output model $22_1$, and thus assists in the calibration of output drivers $26_1$ through $26_4$ falling within area $52_1$; sub-bus $30_2$ services output model $22_2$, and thus assists in the calibration of output drivers $26_5$ through $26_8$ falling within area $52_2$, etc. (In FIG. 6, this relationship between the control signal busses and the output models/output drivers is shown for only the first and eighth sub-busses $30_1$ and $30_8$, for convenience). Because the output drivers 26 each contain X N-channel enable transistors 21 and X P-channel enable transistors 15 (FIG. 3), each sub-bus 30, will contain 2X signals. Thus, for the device illustrated, having the output drivers 26 defined in eight groups or areas, there will be 16X control signals emanating from the state machine 24.

While this increased number of control signals 30 adds layout complexity, significant benefits are achieved by the ability to tailor each of the output drivers (i.e., their impedance) to compensate for the effects of process variations. Take the example noted in the Background in which the transistors at the upper left corner of the integrated circuit 10 had larger line widths than those at the lower right corner. Using the distributed output impedance architecture of FIGS. 6 and 7, such process variations can be accounted for, specifically by enabling more of the enable transistors in the output drivers near the upper left corner (to reduce impedance) and enabling less of the enable transistors in the output drivers near the lower right corner (to increase impedance).

Thus, when calibrating the various output drivers, the state machine 24 might perhaps decide that for output drivers 26 in area $52_1$ all enable transistors (PE1 through PEx and NE1 through NEx) should be enabled to reduce the output impedance to the maximum extent. This is accomplished via the state machine 24's interaction with output model $22_1$: because output model $22_1$ is proximate to the output drivers $26_1$ through $26_4$ in area $52_1$, the state machine 24 via feedback from the output model $22_1$ would understand the transistors in area $52_1$, to be of relatively high resistance, and thus set control signals $30_1$ accordingly to (in this example) enable all of the enable transistors. By contrast, the state machine 24, when calibrating the output drivers 26 in area $52_8$ near the bottom right corner of the integrated circuit 10, might understand transistors in area $52_8$ to be of relatively low resistance, and thus set control signals $30_8$ to enable only one of the enable transistors (e.g., perhaps only PE1 and NE1). For other areas 52 between these two extremes, the state machine 24 might decide that somewhere between all and one of the enable transistors would be optimal. Thus, the control signals 30 would be different for the output drivers 26 in these different areas 52, with the effect being that their output impedances are made more uniform.

Figure 4:
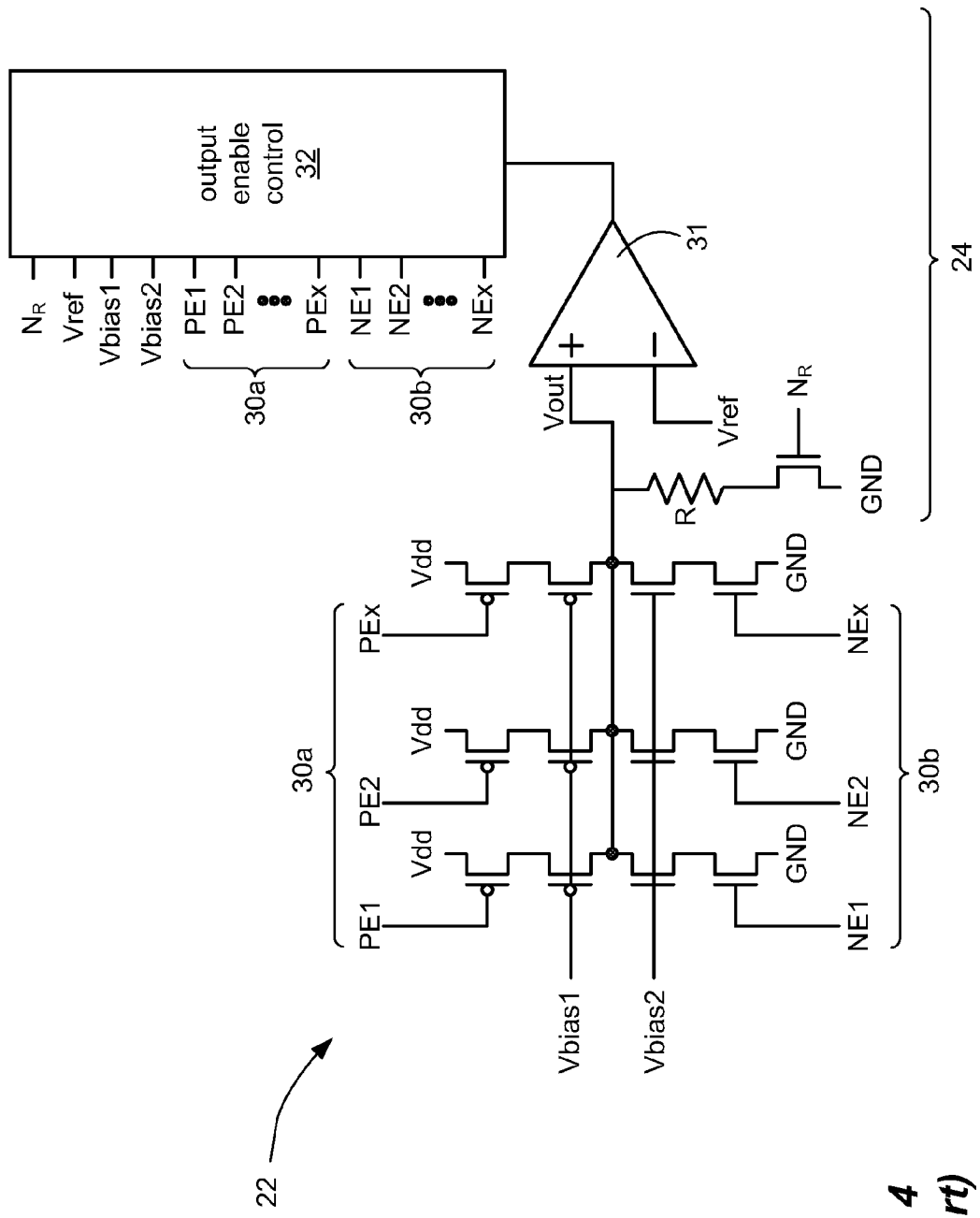
FIG. 4 illustrates output impedance calibration circuitry for generating the control signals for use in the output drivers of FIG. 3 in accordance with the prior art.
Figure 5:
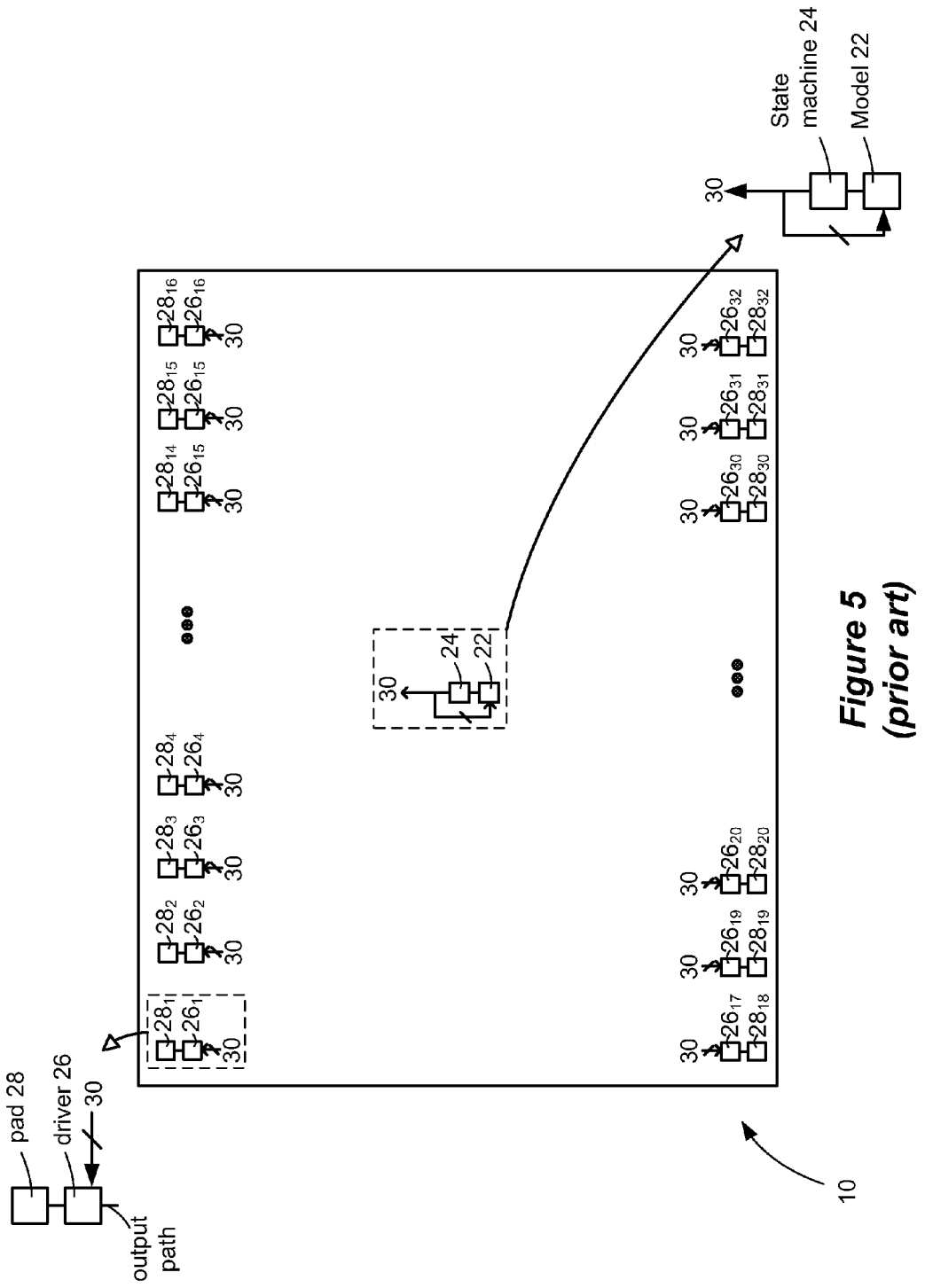
FIG. 5 illustrates the layout of output impedance calibration circuitry and output driver circuitry of the prior art, and illustrates the effects of process variations on the operations of those circuits in accordance with the prior art.
Figure 8:
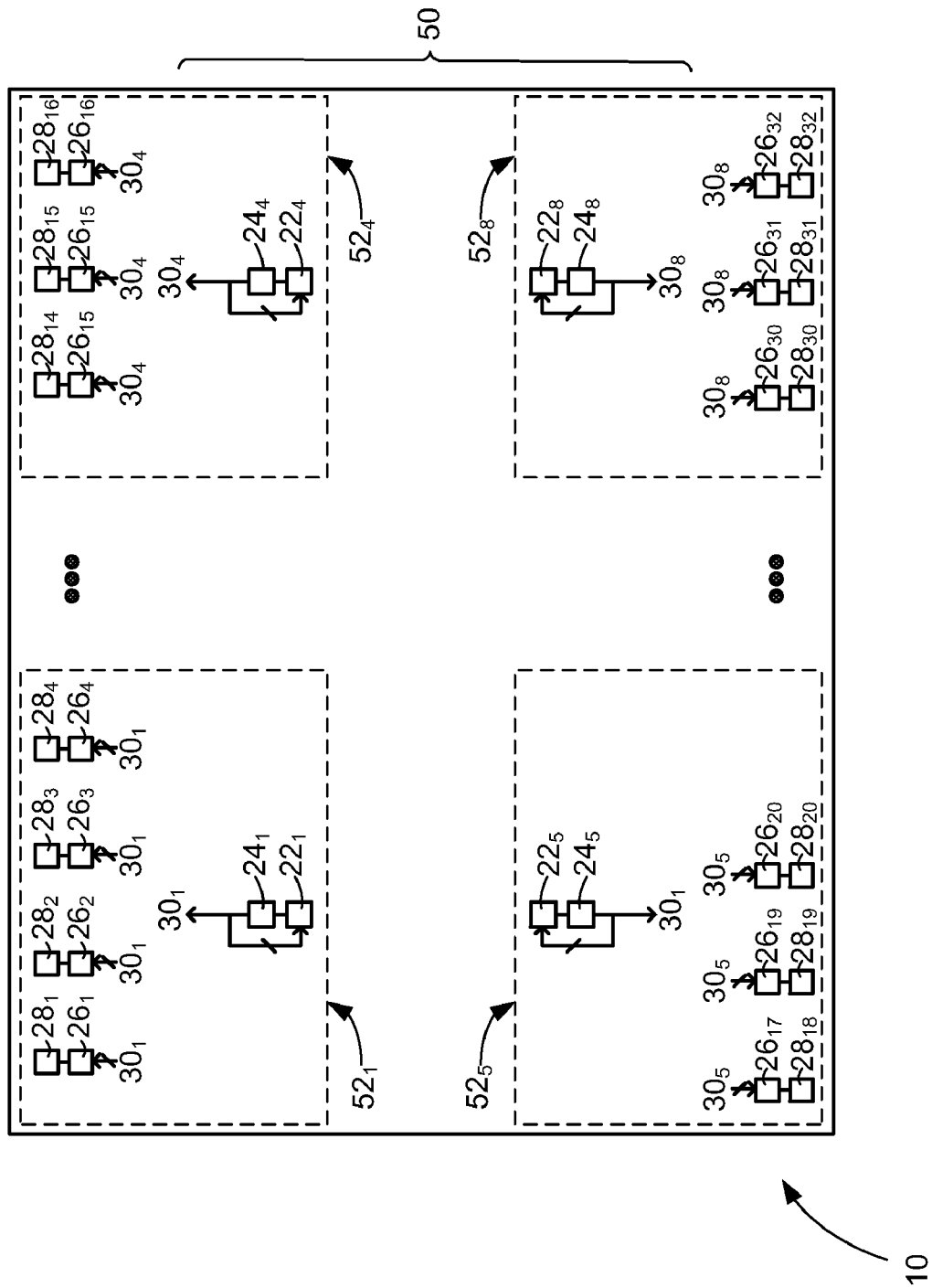
FIG. 8 illustrate another embodiment of the improved output calibration circuitry of FIG. 6 in which one of both a plurality of output models and a plurality of state machines are in proximity to a group of output drivers they model.

The state machine 24 can be constructed similarly to the circuitry shown in FIG. 4, and would most logically be divided into banks corresponding to each of the sub-busses $30_x$/output models $22_x$, although certain devices could remain centralized and shared by the banks, such as operational amplifier 31 and output enable control 32. In an alternative embodiment, shown in FIG. 8, the state machine 24, like the output models 22, can be decentralized to place dedicated portions of the state machine $24_x$ proximate to the output models $22_x$/areas $52_x$/output drivers 26 they service. Thus, for example, state machine $24_1$ is within area $52_1$, services output model $22_1$, and sets the calibration for output drivers $26_1$ through $26_4$, etc. Such decentralization of the state machine 24 could be beneficial if its circuitry is also subject to significant differing performance due to process variations (e.g., in the operational amplifier 31). In one simple embodiment of FIG. 8, the state machine circuitry 24 of FIG. 4 could simply be duplicated at each of these proximate positions, although each would ultimately communicate with a master controller (not shown for convenience).

Although an embodiment of the invention is disclosed in the context of an SDRAM, it should be understood that the techniques and circuitry disclosed herein could be used in different types of integrated circuits, such as PROMs, microprocessors or microcontrollers—basically in any integrated circuit benefiting from the type of output impedance calibration scheme disclosed.

While it is preferred to group a plurality of output drivers 26 within an area 52 for calibration purposes, this is not strictly necessary. In other embodiments, each output driver 26 could have its own proximate output model 22 to specifically tailor the output impedance of that output driver 26. However, because having a dedicated output model for each individual output driver 26 adds circuitry complexity (more control signals 30) and layout (by virtue of the increased number of models 22), it is believed more logical to group several output drivers 26 within an area 52 to a single output model 22 dedicated for the group. Additionally, while it is preferred that the each calibration group contain a set number of output drivers 26 (i.e., four), this is not strictly required as the numbers of output drivers 26 in each group can be of differing sizes.

Moreover, while disclosed in the content of calibration of output impedances, it should be noted that the disclosed technique can also be used to calibrate the input impedance of input circuitry at the pads 28 as well, as well as generic circuit nodes of other types having associated node circuitry requiring impedance calibration. While a detailed discussion is beyond the scope of this disclosure, one skilled in the art will recognize that input impedance calibration can also be accomplished pursuant to the disclosed techniques, i.e., using a representative proximate input model circuit to govern the calibration of groups of input buffer circuitry or other generic node circuitry.

It should be understood that the inventive concepts disclosed herein are capable of many modifications. To the extent such modifications fall within the scope of the appended claims and their equivalents, they are intended to be covered by this patent.

What is claimed is:

1. A method for calibrating the impedance at a plurality of nodes in an integrated circuit, comprising:
  evaluating for each group of a plurality of groups of node circuitry an impedance of a model representative of an impedance of the node circuitry in each group, wherein each group comprises at least one node circuitry, wherein each model is proximate to its associated node circuitry group, wherein each node circuitry comprises X N-channel enable transistors and X P-channel enable transistors, where X is an integer; and
  in response to each evaluated impedance, generating a plurality of sets of control signals for each node circuitry group to calibrate the impedance of the node circuitry in each group, wherein each set of control signals comprises 2X control signals sent to one model and to that model's associated node circuitry, the 2X control signals being independent of each other, and wherein the plurality of control signals are unique to its associated group, wherein each model and its proximate associated node circuitry group are confined to an area of a surface of the integrated circuit, and wherein the areas are distributed about the surface of the integrated circuit.

2. The method of claim 1, wherein the node circuitry comprises output drivers for driving a bond pad.

3. The method of claim 1, wherein evaluating the impedance of the model comprises selectively enabling portions of the model and comparing an output of the model to a reference voltage.

4. The method of claim 1, wherein the node circuitry comprises a plurality of legs, and wherein the control signals selectively enable the plurality of legs.

5. The circuitry of claim 1, wherein each node circuitry is coupled to a bond pad on the integrated circuit.

6. A method for calibrating the output impedance of an integrated circuit comprising a plurality of outputs for sending data to a bus, comprising:
  sending a plurality of control signals to an output model associated with each group of a plurality of groups of output drivers, each group comprising at least one output driver, wherein each output model models the at least one output driver in its associated group, wherein each output model is proximate to the at least one output drivers in its associated group, wherein each output driver comprises X N-channel enable transistors and X P-channel enable transistors, where X is an integer;
  determining for each output model the plurality of control signals which provide an optimum output impedance for its associated group of at least one output driver, wherein the determined plurality of control signals is equal to 2X, the 2X control signals being independent of each other; and
  applying the determined plurality of control signals for each output model only to the at least one output driver in its associated group, wherein each output model and its proximate associated output driver group are confined to an area of a surface of the integrated circuit, and wherein the areas are distributed about the surface of the integrated circuit.

7. The method of claim 6, wherein determining the control signals for each output model comprises selectively enabling portions of the output model and comparing an output of the output model to a reference voltage.

8. The method of claim 6, wherein the output drivers comprise a plurality of legs, and wherein the control signals selectively enable the plurality of legs.

9. The method of claim 6, wherein the control signals are sent to the output model from a state machine.

10. The method of claim 9, wherein the state machine receives feedback from each output model to determine the optimum impedance.

11. The method of claim 9, wherein the state machine is decentralized into portions, each portion being proximate to an associated output model.

12. The method of claim 6, wherein each output driver is coupled to an output pad on the integrated circuit.

13. Circuitry for calibrating the output impedance of an integrated circuit, comprising:
  a plurality of output drivers each associated with an output node, wherein each output driver comprises X N-channel enable transistors and X P-channel enable transistors, where X is an integer;
  a plurality of output models, each output model associated with at least one output driver, wherein each output model models the impedance of its associated at least one output driver; and
  a controller for generating a plurality of sets of control signals, each set of control signals comprising 2X control signals sent to one output model and to that output model's associated output drivers, the 2X control signals being independent of each other, wherein the controller receives feedback indicative of the impedance from each output model for generating the sets of control signals, wherein each output model and its associated at least one output driver are confined to an area of a surface of the integrated circuit, and wherein the areas are distributed about the surface of the integrated circuit.

14. The circuitry of claim 13, wherein each output model is proximate to its associated at least one output driver.

15. The circuitry of claim 13, wherein each set of control signals selectively enables portions of the output model and its associated at least one output driver.

16. The circuitry of claim 13, wherein the controller comprises a comparator for comparing the feedback to a reference voltage.

17. The circuitry of claim 13, wherein each output model and its associated output drivers comprise a plurality of legs, and wherein the set of control signals for each output model and its associated at least one output driver comprises signals for selectively enabling the plurality of legs.

18. The circuitry of claim 13, wherein the controller comprises a state machine.

19. The circuitry of claim 18, wherein the state machine is centralized on the integrated circuit.

20. The circuitry of claim 18, wherein the state machine is decentralized into portions, each portion being proximate to an associated output model.

21. The circuitry of claim 13, wherein each output driver is coupled to an output pad on the integrated circuit.

22. Circuitry for calibrating an impedance at nodes in an integrated circuit, comprising:

node circuitry coupled to each of a plurality of nodes, wherein each node circuitry comprises X N-channel enable transistors and X P-channel enable transistors, where X is an integer, the plurality of node circuitry being of variable impedance;

a plurality of models, each model associated with at least one node circuitry, wherein the model models the impedance of its associated at least one node circuitry; and a controller for generating a plurality of sets of control signals, each set of control signals comprising 2X control signals sent to one model and to its associated at least one node circuitry to vary its impedance, the 2X control signals being independent of each other, wherein the controller receives feedback indicative of the impedance from each model for generating the sets of control signals, wherein each model and its associated at least one node circuitry are confined to an area of a surface of the integrated circuit, and wherein the areas are distributed about the surface of the integrated circuit.

23. The circuitry of claim 22, wherein the node circuitry comprises output drivers, and wherein each model is associated with a plurality of output drivers.

24. The circuitry of claim 22, wherein each model is proximate to its associated at least one node circuitry.

25. The circuitry of claim 22, wherein the controller comprises a comparator for comparing the feedback to a reference voltage.

26. The circuitry of claim 22, wherein each model and its associated at least one node circuitry comprise a plurality of legs, and wherein the set of control signal for each model and its associated at least one node circuitry comprises signals for selectively enabling at least one of the plurality of legs.

* * * * *